United States Patent
Kim

(10) Patent No.: US 10,509,720 B2
(45) Date of Patent: Dec. 17, 2019

(54) APPARATUS AND METHOD TO PERFORM READ RECLAIM OPERATION OF MEMORY DEVICE

(71) Applicant: SK hynix Inc., Gyeonggi-do (KR)

(72) Inventor: Tae-Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/628,840

(22) Filed: Jun. 21, 2017

(65) Prior Publication Data

US 2018/0121343 A1    May 3, 2018

(30) Foreign Application Priority Data

Oct. 27, 2016   (KR) .................. 10-2016-0140863

(51) Int. Cl.

| | |
|---|---|
| G06F 12/02 | (2006.01) |
| H03K 19/003 | (2006.01) |
| G11C 29/00 | (2006.01) |
| G11C 29/02 | (2006.01) |
| G11C 29/50 | (2006.01) |
| G06F 11/10 | (2006.01) |
| G11C 29/04 | (2006.01) |

(52) U.S. Cl.
CPC ...... *G06F 12/0215* (2013.01); *G06F 11/1048* (2013.01); *G11C 29/028* (2013.01); *G11C 29/50004* (2013.01); *G11C 29/82* (2013.01); *H03K 19/00361* (2013.01); *H03K 19/17736* (2013.01); *G06F 12/0246* (2013.01); *G06F 2212/1032* (2013.01); *G06F 2212/7205* (2013.01); *G11C 2029/0409* (2013.01)

(58) Field of Classification Search
CPC .......... G06F 12/0215; H03K 19/17736; G11C 16/28; G11C 16/10; G11C 11/5642; G11C 7/14; G11C 2211/5634
See application file for complete search history.

(56) References Cited

U.S. PATENT DOCUMENTS

| | | | | |
|---|---|---|---|---|
| 9,741,421 B1 * | 8/2017 | Hedden | ............... | G11C 11/406 |
| 2013/0128663 A1 * | 5/2013 | Kim | ............... | G11C 16/10 |
| | | | | 365/185.03 |
| 2014/0146624 A1 * | 5/2014 | Son | ............... | G11C 29/4401 |
| | | | | 365/200 |
| 2015/0049549 A1 * | 2/2015 | Asaoka | ............... | G11C 16/10 |
| | | | | 365/185.12 |
| 2015/0242143 A1 * | 8/2015 | Kim | ............... | G06F 3/0619 |
| | | | | 714/704 |

FOREIGN PATENT DOCUMENTS

| | | | | |
|---|---|---|---|---|
| DE | 2016-44637 A | * | 1/2015 | ............... G01R 31/36 |
| KR | 1020110038083 | | 4/2011 | |
| KR | 1020130087737 | | 8/2013 | |

* cited by examiner

*Primary Examiner* — Harry W Byrne
*Assistant Examiner* — Sultana Begum
(74) *Attorney, Agent, or Firm* — IP & T Group LLP

(57) ABSTRACT

An apparatus may include: a memory device suitable for writing data while erasing at least one monitor cell among a plurality of memory cells in a write mode, and reading the at least one monitor cell by supplying a monitor voltage in a monitor mode; and a controller suitable for transmitting a monitor command and address information for reading the at least one monitor cell to the memory device in the monitor mode, and determining whether to perform a reclaim operation based on the values of the at least one monitor cell read by the memory device.

18 Claims, 15 Drawing Sheets

APPARATUS AND METHOD TO PERFORM READ RECLAIM OPERATION OF MEMORY DEVICE

CROSS-REFERENCE TO RELATED APPLICATIONS

The present application claims priority of Korean Patent Application No. 10-2016-0140863, filed on Oct. 27, 2016, which is incorporated herein by reference in its entirety.

BACKGROUND

1. Field

Exemplary embodiments of the present invention relate to an apparatus and method for controlling a memory device, and more particularly, to an apparatus and method for detecting a read disturb of a memory device.

2. Description of the Related Art

Recently, the paradigm of the computer environment is changed into a ubiquitous computing environment which allows users to get an access to a computer system anywhere anytime. For this reason, the use of portable electronic devices, such as mobile phones, digital cameras, laptop computers and the like, is surging. The portable electronic devices generally employ a memory system using a memory device for storing data. A memory system may be used as a main memory device or an auxiliary memory device of a portable electronic device.

A memory system using a memory device has excellent stability and durability because the data storage device does not include a mechanical driving unit. Also, a memory system using a memory device is advantageous in that it may access data quickly and consume a small amount of power. Non-limiting examples of a memory system having these advantages include a Universal Serial Bus (USB) memory device, a memory card with diverse interfaces, a Solid-State Drive (SSD) and so forth.

A memory device may require a read reclaim operation in order to prevent an uncorrectable error through normal checking and correction caused by a read disturb. However, the memory device (for example, 3D NAND) may have a large read disturb variation at each word line. In this case, the memory device may have difficulties in monitoring the magnitude (amount) of a read disturb. When one block exceeds a preset read count, the memory device may be forced to perform a garbage collection operation.

SUMMARY

Various embodiments are directed to an apparatus and method capable of analyzing a read stress amount in a memory device using a monitor voltage in a monitor mode, the memory device having monitor cells arranged at a specific position of a memory cell array, and thus performing a reclaiming operation.

In an embodiment, an apparatus may include: a memory device suitable for writing data while erasing at least one monitor cell among a plurality of memory cells in a write mode, and reading the at least one monitor cell in a monitor mode; and a controller suitable for transmitting a monitor command and address information for reading the at least one monitor cell to the memory device in the monitor mode, and determining whether to perform a reclaim operation based on the values of the at least one monitor cell read by the memory device.

In an embodiment, an apparatus may include: a controller suitable for transmitting a monitor command and address information at a monitoring cycle; and a memory device suitable for writing data while erasing the at least one monitor cell among a plurality of memory cells in a write mode, supplying a monitor voltage to the at least one monitor cell when the monitor command and address information are received, counting the number of read monitor cells, and transmitting a fail signal to the controller when the count value exceeds a threshold value. The controller may set the corresponding region of the memory device to a reclaim region when the fail signal is received.

In an embodiment, a method for controlling a memory device may include: transmitting a write command, address information and data to a memory device having at least one monitor cell set to one or more memory cells at a specific position in a write mode, the data being configured to erase the at least one monitor cell; and performing a monitor mode. The monitor mode may include: transmitting a monitor command and address information of a monitoring region to the memory device at a monitoring cycle; receiving the values of the at least one monitor cell read by a monitor voltage supplied to the monitoring region in the memory device; and determining a read disturb amount by counting the number of monitor cells changed from an erase state among the at least one monitor cell read in the memory device.

In an embodiment, there is provided an operating method of a memory device, the memory device including a memory cell array in which memory cells at a specific position are set to monitor cells written in an erase state. The operating method may include: receiving a monitor command and address information at a monitoring cycle; supplying a monitor voltage to at least one monitor cell of a region corresponding to the address information when the monitor command is received; reading data of the at least one monitor cell; and transmitting a fail signal for reclaiming the corresponding region when the number of monitor cells changed from an erase state exceeds a preset threshold value.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
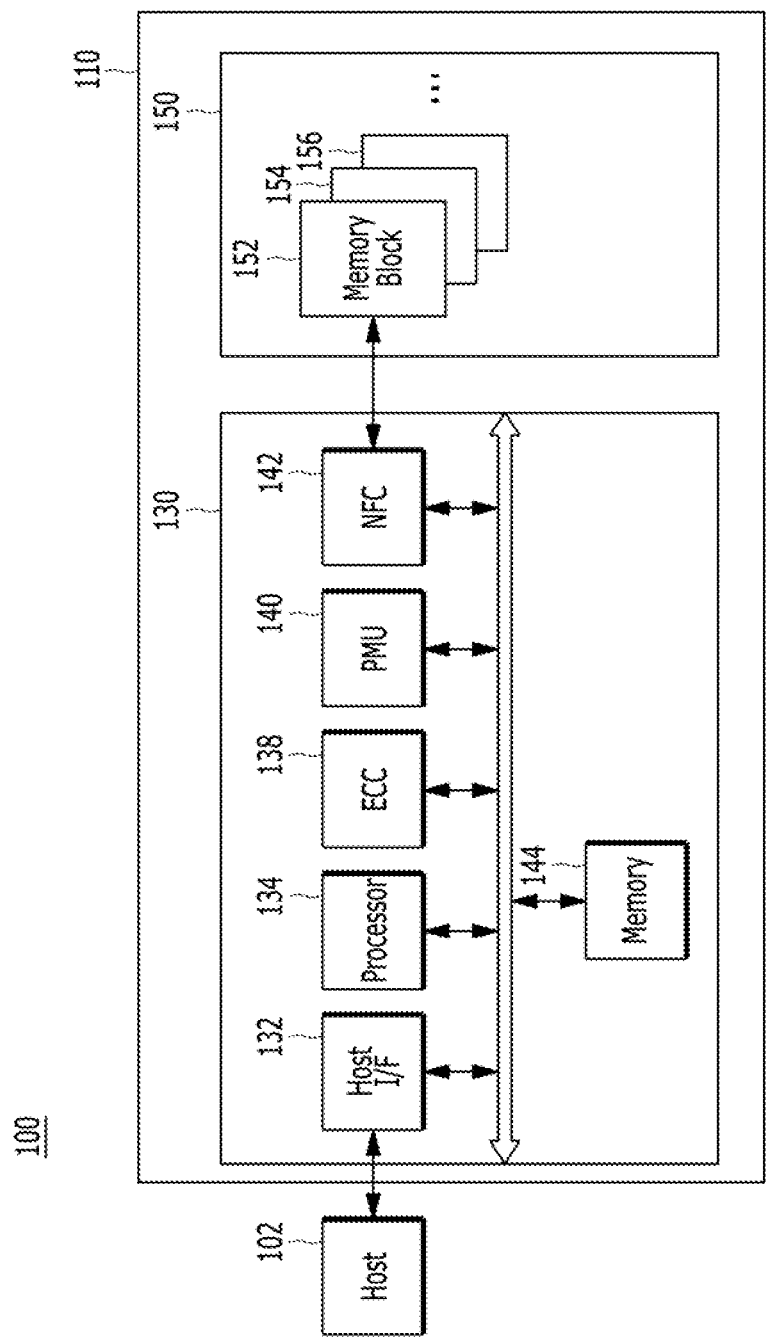
FIG. 1 is a block diagram illustrating a data processing system including a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, b, and C.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do to not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may be any suitable electronic device including portable electronic devices such as a mobile phone, MP3 player and laptop computer or non-portable electronic devices such as a desktop computer, game machine, TV and projector. The host 102 may include at least one OS (operating system), and the OS may manage and control the overall functions and operations of the host 102, and also provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include one or more of Oss. The host 102 may execute an OS to perform an operation corresponding to a user's request on the memory system 110.

The memory system 110 may operate to store data for the host 102 in response to a request of the host 102. Non-limited examples of the memory system 110 may include a solid state drive (SSD), a multi-media card (MMC), a secure digital (SD) card, universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limited examples of storage devices included in the memory system 110 may include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fall signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 is an example of a memory/storage interface for interfacing the controller 130 and the memory device 150 when the memory device is a NAND flash memory, such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150. Other memory/storage interfaces may be used when a different type memory device is employed.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
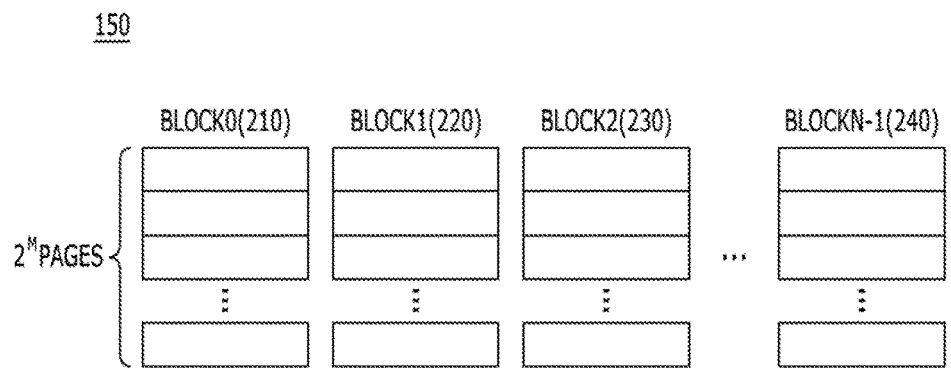
FIG. 2 illustrates a memory device in a memory system in accordance with an embodiment of the present invention.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, a multi-level cell (MLC) storing 2-bit data, an MLC storing 3-bit data also referred to as a triple level cell (TLC), an MLC storing 4-bit data also referred to as a quadruple level cell (QLC), or an MLC storing 5-bit or more bit data.

Figure 3:
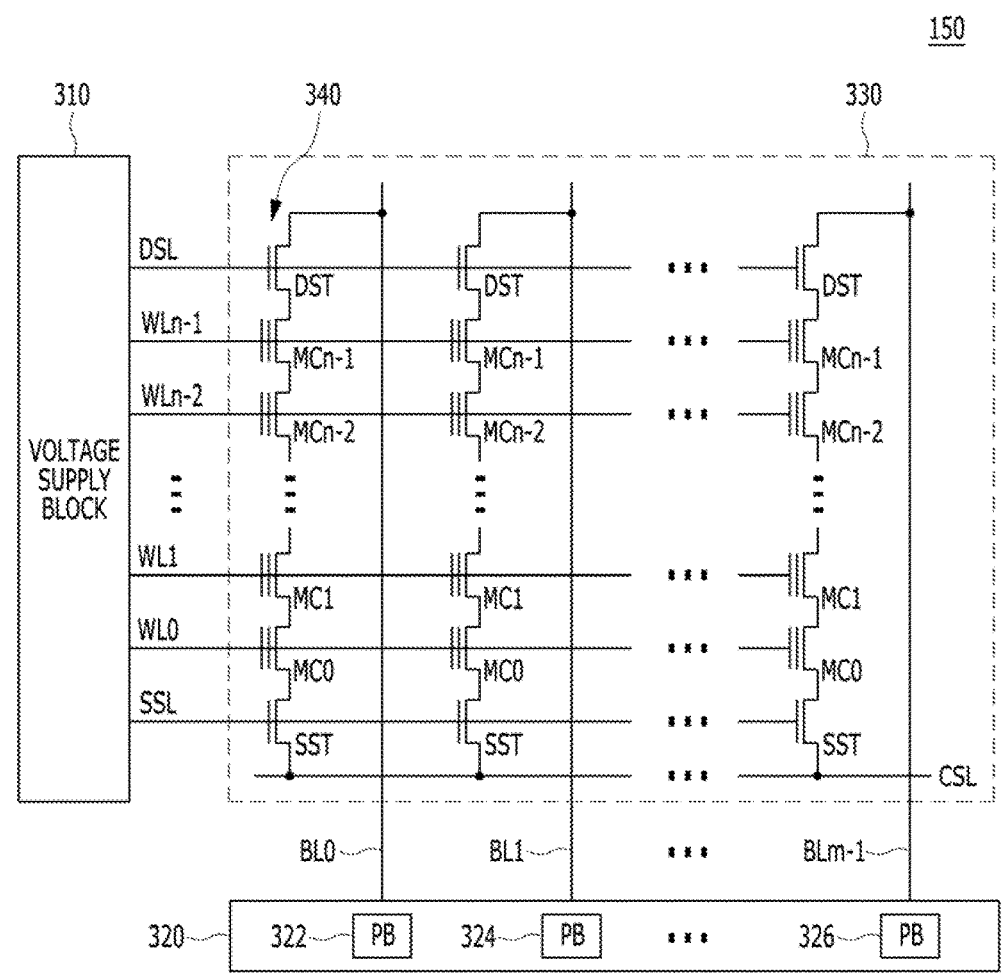
FIG. 3 is a diagram illustrating a memory cell array circuit of memory blocks in a memory device in accordance with an embodiment of the present invention.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. For example, it is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
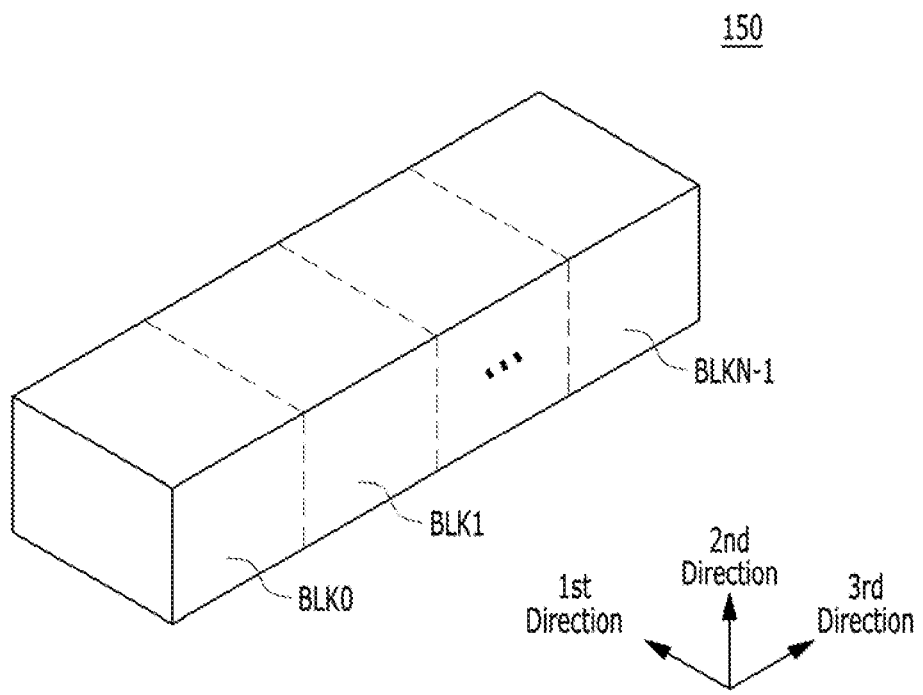
FIG. 4 illustrates a structure of a memory device in a memory system in accordance with an embodiment of the present invention.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

A nonvolatile memory device such as a flash memory device may perform a read reclaim operation in order to prevent uncorrectable errors through the device's ECC (Error Correction Code) caused by a read disturb. The read reclaim operation may include physically transferring and storing error-corrected data into another memory region of the memory device, e.g., a different page of the memory device. However, the memory device (for example, 3D NAND) may have a read disturb variation present in each word line, which may make it difficult to monitor the amount of read disturb. As a result, it may be required to perform a garbage collection on the device when the read count of one block of the device exceeds a preset read count. Memory devices in accordance with an embodiment may include an apparatus and may perform a method for setting a monitor cell region in a block, and checking at least some of the monitor cells when the read count of the block reaches a preset value, in order to measure a read stress level of the memory device. Furthermore, the memory devices in accordance with an embodiment may include an apparatus and may perform a method for setting a monitor cell region in a block, and checking at least some of the monitor cells when the amount of read disturb reaches a preset value or the number of read fails reaches a preset count, for measuring a read stress level of the memory device. The memory device may then determine whether to perform a read reclaim operation based on the measured read stress level of the memory device.

A non-volatile memory device, for example, a NAND flash memory may write or read data on a page basis, and erase data on a block basis. A reclaim operation of the memory device may be performed on a page or block basis. In an embodiment, a controller may transmit a monitor read command and address information to the memory device, in order to detect the amount of read disturb in the memory device. The address information transmitted to the memory device in a monitor mode may include a page address or a block address. In the following descriptions, the address information which the controller transmits to the memory device will be referred to as block address information. The block address information may include an address for designating a specific page region of the memory device or an address for designating a specific block region of the memory device. That is, the term "block address information" in the embodiment may be used as a term including a page address or block address.

Figure 5A:
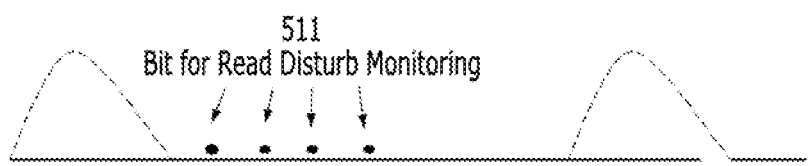
FIGS. 5A and 5B are diagrams illustrating a method for measuring read stress of a memory device in accordance with an embodiment.
Figure 5B:
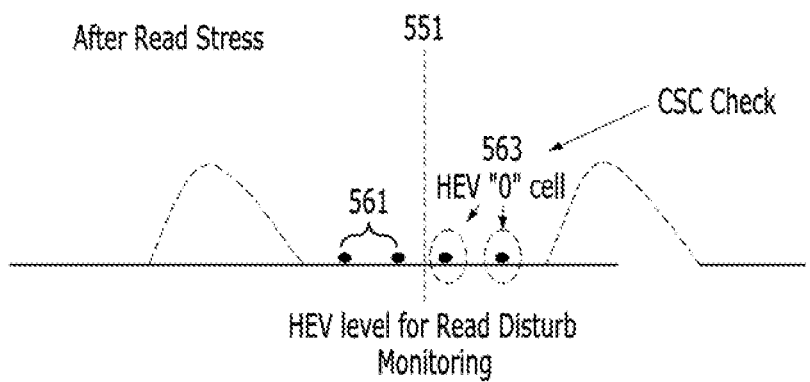

FIGS. 5A and 5B are diagrams illustrating a method for measuring read stress in a memory device in accordance with an embodiment. FIG. 5A is a diagram illustrating a state before read stress is generated, and FIG. 5B is a diagram illustrating a state after read stress is generated.

Referring to FIGS. 5A and 5B, cells (i.e., bits) located at specific positions in each word line of a memory device may be set to be monitor cells 511 for monitoring read disturb. The memory device may correspond to the memory device 150 of FIG. 1. When writing data in a data write mode or program mode, the memory device may retain the monitor cells in an erase state such that the monitor cells are not programmed, as illustrated in FIG. 5A. In the following descriptions, write and program will be described as terms having the same meaning. The charge distribution of the monitor cells before read stress may be represented by 511. After the write mode is performed, the memory device may perform a read operation. When the read operation is performed, a controller or the memory device may count the number of read operations in a read block. The controller may correspond to the controller 130 of FIG. 1. When the read count increases, the charge distribution of the monitor cells may be changed as illustrated in FIG. 5B. For example, the charge distribution of the monitor cells, represented by reference number 511 of FIG. 5A, may be changed to charge distributions 561 and 563 in FIG. 5B.

The controller or the memory device may perform a monitor mode at a specific read cycle, and read the monitor cells at a monitor voltage level for monitoring a read disturb. In accordance with an embodiment, the monitor mode may be performed at a point of time that a read count value becomes a preset count value. In accordance with another embodiment, the monitor mode may be performed when the number of sensed read fails is equal to or more than a preset number. For example, a hard erase verify (HEV) voltage 551 may be set as the monitor voltage for sensing disturb. The monitor voltage (e.g., HEV voltage) 551 may be used to check the states of erase-programmed monitor cells. When the controller transmits a monitor read command and block address information for monitoring a read disturb amount to the memory device, the memory device may supply the HEV voltage to memory cells, and measure the read disturb amount by reading the monitor cells of the corresponding block. Alternatively, the memory device may transmit the read information of the monitor cells to the controller, and the controller may measure a read disturb amount by analyzing the changes of the monitor cells.

In an embodiment, suppose that the monitor cells are retained in the erase state and the erase level is set to 1 (i.e., logical 1). In the case of FIG. 5A, when the HEV voltage is supplied, the memory device may sense the values of all monitor cells as 1 (i.e., erase state). Then, when read stress is caused, the charge distribution of the monitor cells may be changed as illustrated in FIG. 5B. In the monitor mode, when the memory device supplies the HEV voltage (i.e., monitor voltage) 551 to the monitor cells, the monitor cells having the charge distribution 561 may be sensed as 1, and the monitor cells having the charge distribution 563 may be sensed as 0. That is, the memory device may check the states of the monitor cells by reading the monitor cells based on the monitor voltage (e.g., HEV level for read disturb monitoring) in the monitor mode. For example, the memory device may perform a current sensing counter (CSC) check. When the check result indicates that the number of monitor cells read as 0 is equal to or more than a specific number, the memory device may determine that the read disturb amount exceeds a preset threshold value, and thus designate the corresponding block as a reclaim block.

Figure 6:
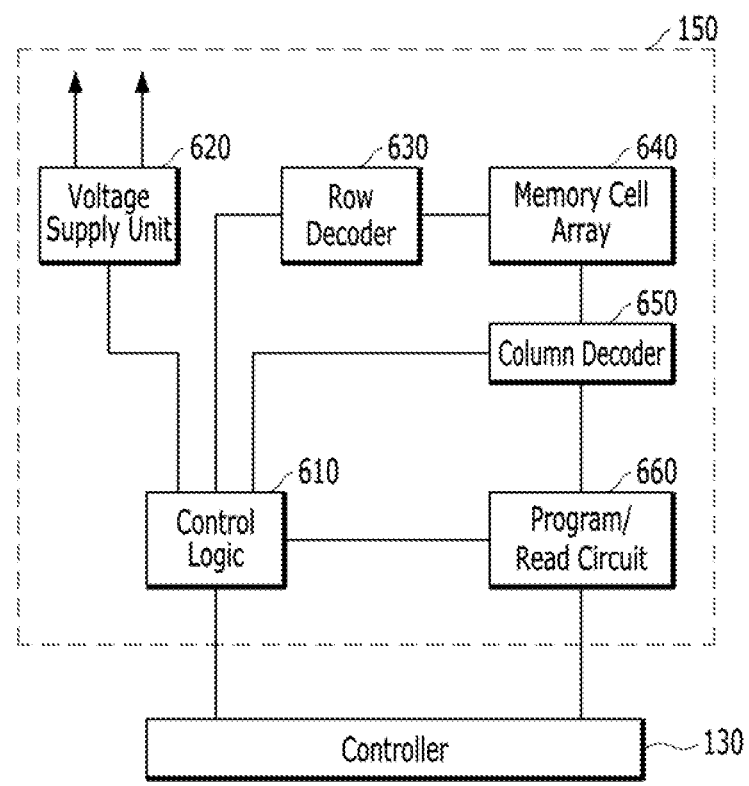
FIG. 6 is a diagram illustrating the configuration of a memory device in accordance with an embodiment.

FIG. 6 is a diagram illustrating the configuration of a memory device in accordance with an embodiment.

Referring to FIG. 6, the memory device 150 may include control logic 610, a voltage supply unit 620, a row decoder 630, a memory cell array 640, a column decoder 650 and a program/read circuit 660.

The memory cell array 640 may correspond to the memory block 330 of FIG. 3. The memory cell array 640 may include a plurality of cell strings coupled to bit lines BL0 to BLm−1, respectively. In an embodiment, one or more bit lines among the bit lines BL0 to BLm−1 may be set to a bit line having monitor cells arranged therein. For example, the last bit line (or cell string) BLm−1 at which the last cells of the respective word lines are arranged may be set to be a monitor cell string.

The row decoder 630 may be coupled to the memory cell array 640 through the word lines WL, and select one or more of the word lines WL in response to a row address X_ADDR. The column decoder 650 may be coupled to the memory cell array 640 through the bit lines BL, and select one or more of the bit lines BL in response to a column address Y_ADDR. The column decoder 650 may select a bit line to which monitor cells are coupled, in the monitor mode.

The program/read circuit 660 may correspond to the read/write circuit 320 of FIG. 3. The program/read circuit 660 may include a current sensing counter (CSC) for sensing the currents of the monitor cells coupled to the monitor cell string (for example, BLm−1). The program/read circuit 660 may count the states (e.g., an erase state) of the monitor cells of the monitor cell string by sensing the currents of the monitor cells and output a pass or fail signal, during the monitor mode. For example, the program/read circuit 660 may output the fail signal when the CSC value exceeds a preset threshold in the monitor mode. Otherwise, the program/read circuit 660 may output the pass signal.

The voltage supply unit 620 may correspond to the voltage supply unit 310 of FIG. 3. The voltage supply unit 620 may supply a monitor voltage (for example, HEV voltage) for measuring a read disturb amount to the memory cell array 640 in the monitor mode.

The control logic 610 may output a control signal and address signals for programming data to the memory cell array 640 or reading data from the memory cell array 640, based on a command CMD, an address ADDR and a control signal CTRL which are received from the controller 130. The control logic 610 may include a read counter to count the number of read operations for the memory cells. The read counter may count the number of read operations for a block or page of the memory cell array 640. The control logic 610 may convert the value of the read counter into data, and transmit the data to the controller 130. Alternatively, the read counter may be included in the controller 130.

In accordance with an embodiment, the memory device (for example, the memory device 150 of FIG. 1) may include a 3D NAND flash memory.

The memory cell array 640 may include a plurality of memory blocks BLK1 to BLKz. Each of the memory blocks may have a 3D structure (or vertical structure). In a memory block having a 2D structure (or horizontal structure), memory cells may be formed in the horizontal direction with respect to the substrate. On the other hand, the memory block having a 3D structure may include memory cells formed in the vertical direction with respect to the substrate, and each of the memory blocks may be subjected as a unit to an erase operation of a flash memory device. For example, the 3D flash memory may be fabricated by stacking a plurality of layers in the vertical direction with respect to a substrate and forming a channel hole through the layers.

Each of the memory blocks in the 3D flash memory may include NAND strings connected between bit lines and a common source line CSL. Each of the NAND strings may include a drain select transistor DST, a plurality of memory cells, and a source select transistor SST. The source select transistor SST may be coupled to a drain selection line, the plurality of memory cells may be coupled to the corresponding word lines, the source select transistor SST may be coupled to a source selection line, the drain select transistor DST may be coupled to a bit line BL, and the source select transistor SST may be coupled to the common source line.

The word lines at the same level may be coupled in common, and the source selection lines and the drain selection lines may be isolated from each other. When memory cells (or page) coupled to one word line and belonging to a plurality of NAND strings are programmed, the corresponding word line WL and the corresponding selection lines DSL and SSL may be selected. In an embodiment, one or more bit lines among the bit lines (for example, bit lines BL0 to BLm−1 of FIG. 3) may be set to a bit line having monitor cells arranged therein. For example, the last bit line (i.e., cell string) BLm−1 at which the last cells of the respective word lines are arranged may be set to a monitor cell string. In an embodiment, the memory system may program the bit line of the monitor cells into a non-programmed state (for example, erase state) in the program mode (i.e., write mode).

In an embodiment, when receiving a write command and address, the control logic 610 may program data while retaining the monitor cells in the erase state. The monitor cells may be located at the monitor cell string (bit line) of the memory cell array 640.

In an embodiment, when receiving a monitor mode command address, the control logic 610 may control the voltage supply unit 620 to supply the monitor voltage to the memory cell array 640, select a monitor cell string through the column decoder 650, and transmit signals read from the selected monitor cells to the controller 130.

In an embodiment, when receiving a monitor mode command and address, the control logic 610 may control the voltage supply unit 620 to supply the monitor voltage to the memory cell array 640, select a monitor cell string through the column decoder 650, and count the number of monitor cells of which the states were changed (monitor cells in non-erase state). When the number of monitor cells of which the states were changed exceeds a preset value, the control logic 610 may generate a fall signal and transmit the fall signal to the controller 130. Otherwise, the control logic 610 may generate a pass signal and transmit the pass signal to the controller 130.

In an embodiment, the controller 130 may transmit a write command, address information and data to the memory device 150. Data transmitted in a write mode may include erase data which are to be written to the positions of the monitor cells of the memory device 150. For example, the monitor cell string may correspond to the positions of the last cells of the word lines, and the last bit line (for example, BLm−1 in FIG. 3) may serve as the monitor cell string. When transmitting data to the memory device 140 in the write mode, the controller 130 may set data to be written to the monitor cell string of the memory device 140, and transmit the data as erase data. Furthermore, in the read mode, the controller 130 may remove data which are read from the monitor cell string among read data received from the memory device 150.

In an embodiment, the controller 130 may transmit a monitor read command and address information to the memory device 150 at a specific read cycle. The specific read cycle may be set to a point of time that the read count value reaches a preset count.

In an embodiment, after transmitting the monitor read command and address information to the memory device 150, the controller 130 may check the states of the monitor cells, transmitted from the memory device 150, and determine whether to perform a reclaim operation. For example, the controller 130 may count the number of monitor cells changed from the erase state. When the count value exceeds a preset value, the controller 130 may reclaim the corresponding block of the memory device 150.

In an embodiment, after transmitting the monitor read command and address information to the memory device 150, the controller 130 may determine whether to perform a reclaim operation, according to a read stress result transmitted from the memory device 150. For example, when the memory device 150 transmits a fail signal in the monitor mode, the controller 130 may reclaim the corresponding block of the memory device 150.

Figure 7:
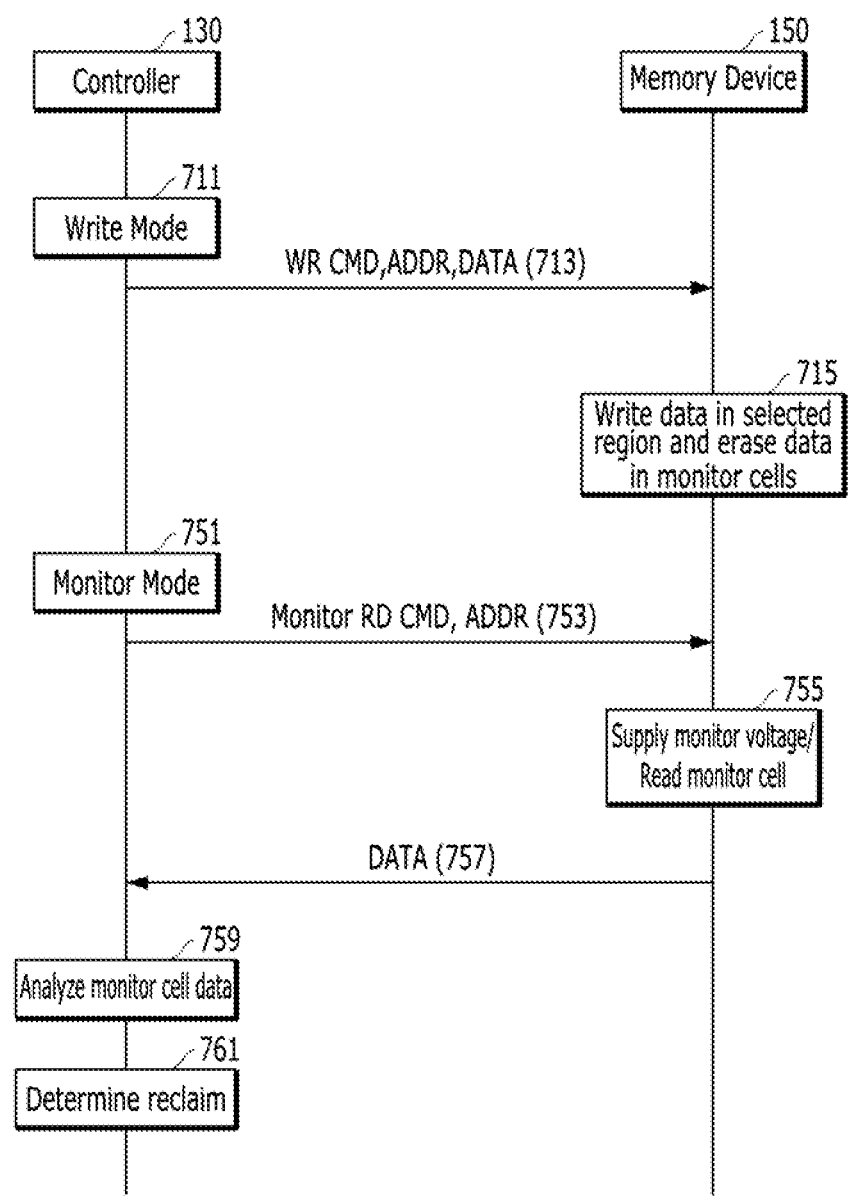
FIG. 7 is a diagram illustrating a method for searching a read disturb in a memory system in accordance with an embodiment.

FIG. 7 is a diagram illustrating a method for searching a read disturb in the memory system in accordance with an embodiment.

Referring to FIG. 7, the controller 130 may enter in a write mode for writing data to the memory device 150 at step 711. In the write mode, the controller 130 may transmit a write command WR CMD, an address ADDR and data DATA to the memory device 150 at step 713. The memory device 150 may select a read bias voltage and a region in the memory cell array 640 according to the write command and address information, and write data to the selected region, at step 715. At step 715, the memory device 150 may write erase data to a specific bit line (i.e., column cell string) where the monitor cells are located. For example, the last cells of the word lines (e.g., bit line BLm−1 of FIG. 3) may be set to be the monitor cells. The data may be stored on a page basis based on page address information.

The operation of erasing the monitor cells of the memory device 150 in the write mode may be performed by the controller 130 or performed by the memory device 150. In the former method, the controller 130 may recognize the positions of the monitor cells set in the memory device 150. According to the program mode, the controller 130 may transmit address information and data to the memory device 150. At this time, the controller 130 may set partial data of the transmitted data sequence to the erase value, the partial data being written to the positions of the monitor cells. That is, the data transmitted to the memory device 150 from the controller 130 may have a data sequence in which the erase value is inserted into the monitor cell positions. When data are written through the former method, the controller 130 may ignore data read from the monitor cells in the read mode. That is, the controller 130 may reconfigure the data sequence by removing the data read from the monitor cells among the data read from the memory device 150.

According to the latter method, no data may be written to the bit line (i.e., cell string) where the monitor cells are located, in the write mode. In the program mode, the memory device may write data without selecting the bit line where the monitor cells are located. Therefore, monitor cells coupled to a bit line located at a specific position may retain the erase state. In the read mode, the memory device may read data of the bit lines excluding the bit line to which the monitor cells are coupled, and output the read data.

The controller 130 may perform the monitor mode at step 751. The monitor mode may include an operation mode for detecting the amount of read disturb in the memory device 150. The monitor mode may be performed at a specific cycle. The specific cycle may be set to a point of time that the read count exceeds a preset count. When the value of the read counter exceeds the preset count or read count data transmitted from the memory device 150 exceeds a preset value, the controller 130 may transmit a monitor read command RD CMD and address information ADDR to the memory device 150 at step 753. The address information may include the address information of a block in which the read count exceeds the preset value. When the monitor read command and address information are received, the memory device 150 may select the corresponding block of the memory cell array 640 based on the address information, and supply the monitor voltage (e.g., HEV voltage) to the memory cell array 640 according to the monitor read command. The memory device 150 may read monitor cells at specific positions at step 755. For example, the memory device 150 may sense the currents of monitor cells coupled to a specific bit line according to the HEV voltage. For example, when the value of a monitor cell is read as "0" in the monitor mode even though the value of the monitor cell was written as "1" (erase value) in the write mode, it may indicate that a read disturb variation occurred.

When the monitor read command and address information are received, the memory device 150 may supply the HEV voltage to a selected block region of the memory cell array 640, select the monitor cell string (for example, the last bit line) of the memory cell array 640, and read the values of the monitor cells. The memory device 150 may transmit the read values of the monitor cells to the controller 130 at step 757. The controller 130 may analyze the values of the monitor cells, transmitted from the memory device 150, at step 759. According to the analysis result, the controller 130 may determine whether to reclaim the corresponding block at step 761. For example, the controller 130 may count the number of monitor cells of which the erase states were changed (for example, changed from 1 to 0). When the count value exceeds a preset threshold value, the controller 130 may set the corresponding block as a reclaim block. On the other hand, when the count value is smaller than the threshold value, the controller 130 may wait for the next cycle.

Figure 8:
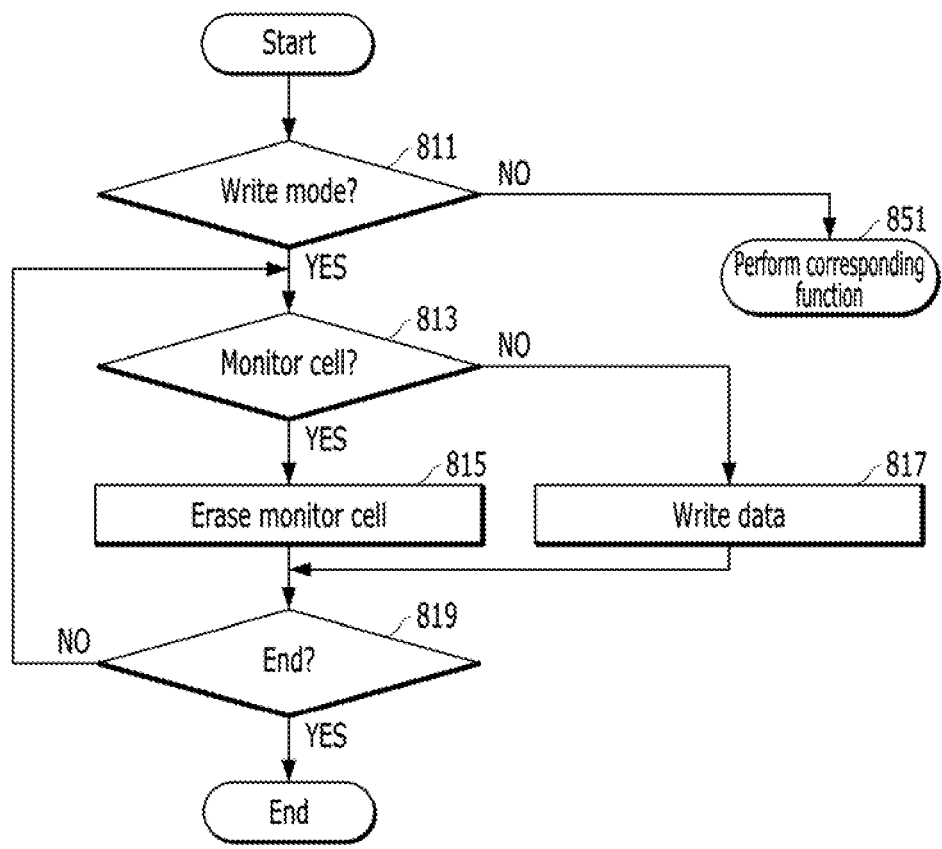
FIG. 8 is a flowchart illustrating a data write method of a memory device in accordance with an embodiment.

FIG. 8 is a flowchart illustrating a data write method of the memory device 150 in accordance with an embodiment of the present invention.

Referring to FIG. 8, when a write command, address and data are received from the controller 130, the memory device 150 may recognize the write command, address and data, and may enter a write mode to perform a data write operation at step 811. When performing the data write operation, the memory device 150 may check whether the position to which the data are written corresponds to a monitor cell position, at step 813. When it is determined that the write position corresponds to the monitor cell position, the memory device 150 may retain the erase state without performing the data write operation at the corresponding cell position, at step 815. On the other hand, when it is determined that the write position does not correspond to a monitor cell position, the memory device 150 may recognize that the write position does not correspond to a monitor cell position, at step 813, and may write data to the corresponding cell position at step S817. The memory device 150 may perform the write operation of writing data to memory cells and retaining the monitor cells in the erase state, while repeating the operation from steps 813 to step 817. When the write operation is completed, the memory device 150 may recognize the completion of the write operation and end the write mode, at step 819. When it is determined that the write operation is completed, the memory device 150 may end the data write method above. When it is determined that the write operation is not completed, the memory device 150 may proceed to the step 813. When it is determined that the current mode is not the write mode at step 811, the memory device 150 may perform the corresponding operation at step 851. The memory device 150 may perform an operation such as the data read mode or erase mode at step 851.

FIG. 8 illustrates an exemplary operation of analyzing the positions of the monitor cells in the memory device 150. However, in a variation of this embodiment, the memory device 150 may just store data received in the write mode into the memory cell array 640. In this case, the controller 130 may recognize the positions of the monitor cells set in the memory device 150. When transmitting write data to the memory device 150, the controller 130 may previously set data (i.e., erase data) which are to be written to the positions of the monitor cells. That is, when transmitting address information and data, the controller 130 may reconfigure the data sequence such that the erase data can be inserted into the positions of the monitor cells, and transmit the data sequence containing the erase data to the memory device 150. Furthermore, the memory device 150 may just store data received in the write mode into the memory cell array 640, based on the address information. Then, in the read mode, the controller 130 may remove data read from the monitor cell positions, and then transmit the data to a host.

Figure 9:
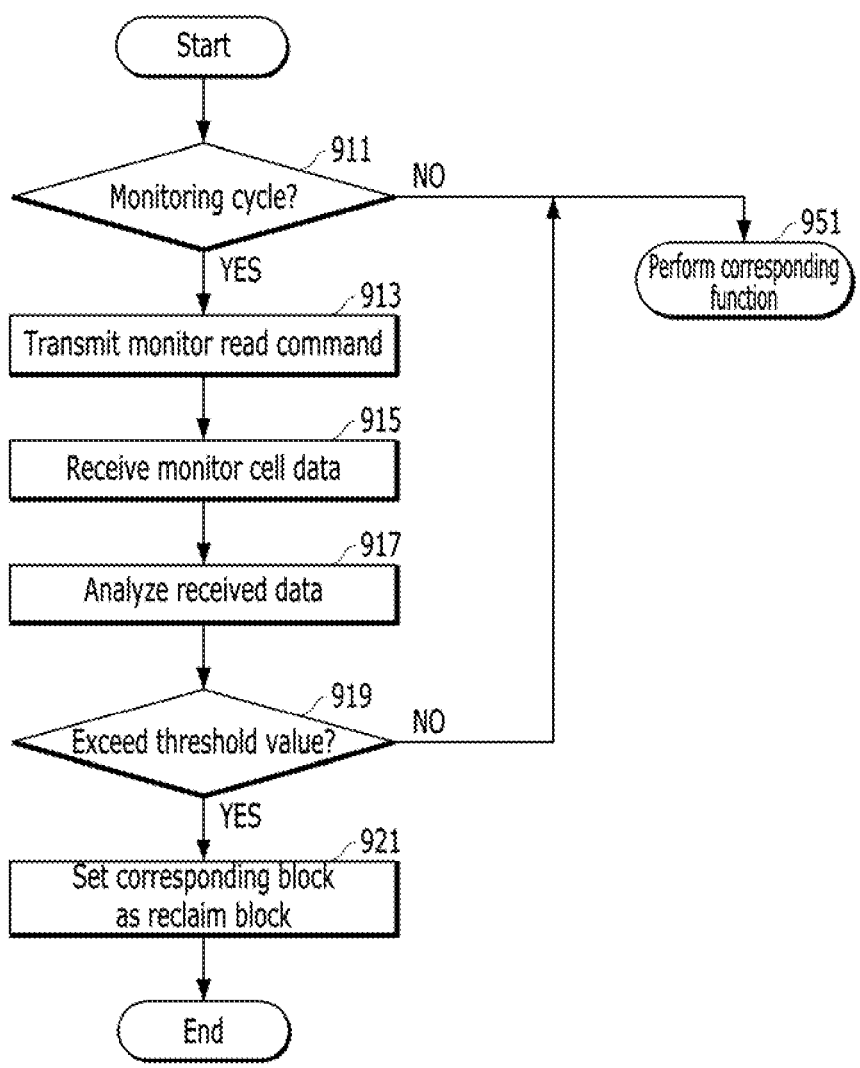
FIG. 9 is a flowchart illustrating a method in which a controller controls a memory device to operate in a monitor mode in accordance with an embodiment.

FIG. 9 is a flowchart illustrating a method in which a controller 130 controls the memory device 150 to operate in the monitor mode in accordance with an embodiment of the present invention.

Referring to FIG. 9, the controller 130 may check the value of the read counter and determine when to perform the monitor mode, i.e., whether or not to enter into a monitoring cycle, at step 911. The controller 130 may perform the monitor mode on one or more blocks having a read counter value that exceeds a preset count. The read counter may be performed by the controller 130, or data of read counter may be received from the memory device 150. When determining that it is cycle to perform the monitor mode, the controller 130 may recognize the monitoring cycle to perform the monitor mode at step 911, and transmit a monitor read command and address information of a block to monitor to the memory device 150, at step 913.

Then, when read information of monitor cells is transmitted from the memory device 150, the controller 130 may receive the read information i.e., may receive monitor cell data at step 915. Then, the controller 130 may analyze the received data at step 917. The analysis may include counting the number of monitor cells of which the erase states were changed. Then, the controller 130 may determine whether the count value exceeds a threshold value, at step 919. When determining that the count value exceeds the threshold value, the controller 130 may set the corresponding block as a reclaim block at step 921. On the other hand, when the count value is smaller than the threshold value, the controller 130 may recognize that the count value is smaller than the threshold value at step 919, and perform a corresponding function at step 951.

Figure 10:
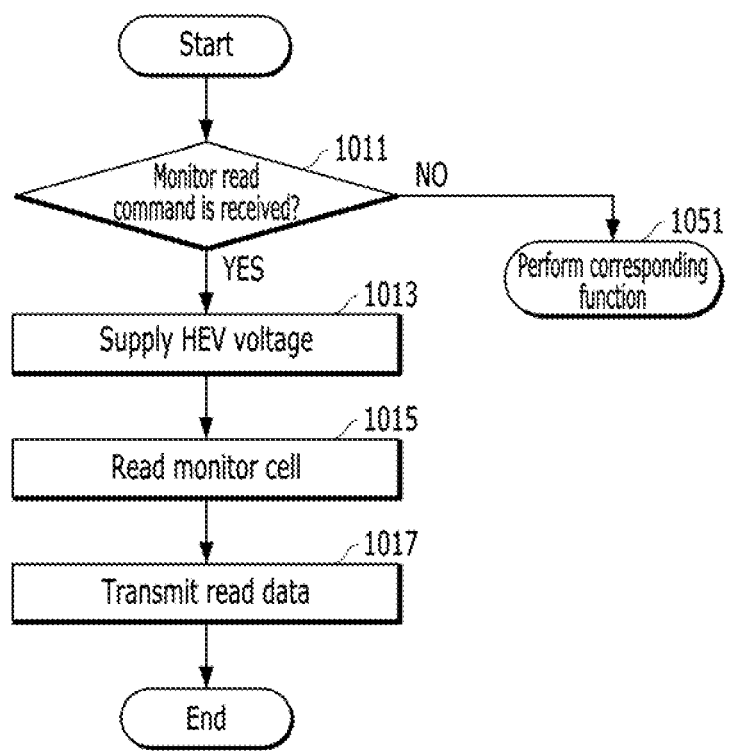
FIG. 10 is a flowchart illustrating an operation of a memory device to perform a monitor mode in accordance with an embodiment.

FIG. 10 is a flowchart illustrating an operation of the memory device 150 to perform a monitor mode in accordance with an embodiment of the present invention.

Referring to FIG. 10, when a monitor read command (and address information) is received from the controller 130, the memory device 150 may recognize the monitor read command and related received address information at step 1011, and supply the monitoring voltage (e.g., HEV voltage) to the corresponding block of the memory cell array 640 at step 1013. The memory device 150 may read the values of monitor cells coupled to a specific bit line of the corresponding block at step 1015, and transmit the read data of the monitor cells to the controller 130 at step 1017. At this time, the read data of the monitor cells may be changed depending on the read stress level.

The monitor cells may be written with the erase value in the write mode. When the HEV voltage is supplied as the monitoring voltage while the read stress level is small as illustrated in FIG. 5A, the monitor cells may be read as having the erase value (for example, "1"). Then, the charge distribution of the monitor cells in a region where the read stress level increases as illustrated in FIG. 5B may be changed, and a part of the monitor cells may be read as having a value deviating from the erase level (for example, "0") when the read operation is performed by the HEV voltage. When receiving the monitor read command and block address information from the controller 130, the memory device 150 may select a corresponding bit line, i.e., a column string to which monitor cells arranged at specific positions of the corresponding block are coupled, read the values of the selected monitor cells based on the HEV voltage, and transmit the read data to the controller 130. The controller 130 may determine the read disturb level by counting the number of monitor cells in the non-erase state (for example, monitor cells of which the read values were changed from 1 to 0) among the monitor cells read by the memory device 150. Then, when the read disturb level exceeds a threshold value, the controller 130 may set the corresponding block to be a reclaim block.

Figure 11:
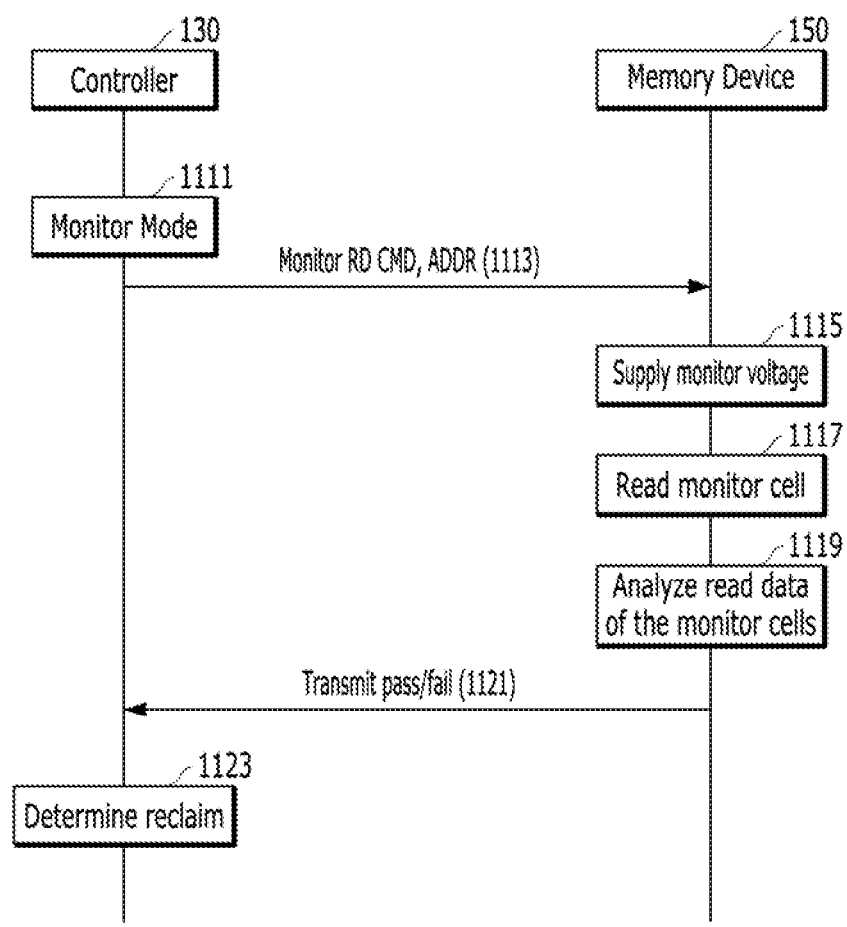
FIG. 11 is a diagram illustrating another method for measuring read stress of a memory device in accordance with an embodiment.

FIG. 11 is a diagram illustrating another method for measuring the read stress of the memory device 150 in accordance with an embodiment of the present invention.

Referring to FIG. 11, the controller 130 and the memory device 150 may write data while the monitor cells set at specific positions of the memory device 150 are retained in the erase state, in the write mode. In order to write the monitor cells into the erase state, the controller 130 may reconfigure a data sequence, or the memory device 150 may write data to a region excluding the positions of the monitor cells.

The controller 130 may perform the monitor mode at a specific point of time. The monitor mode may be performed at a point of time when the value of the read counter exceeds a preset value. Furthermore, the monitor mode may be performed at a point of time when a read disturb is sensed. The controller 130 may start the monitor mode at step 1111, and transmit the monitor read command RD CMD and address information ADDR to the memory device 150 at step 1113. When the monitor read command is executed, the memory device 150 may select a block corresponding to the address information, and supply the monitor voltage as the HEV voltage to the selected block, at step 1115. The memory device 150 may read the values of the monitor cells in the corresponding block at step 1117, and generate a read stress detection result by performing an analysis of the read values of the monitor cells at step 1119.

The memory device 150 may include a current sensing counter (CSC). In the monitor mode, the memory device 150 may supply the HEV voltage to the selected block region of the memory cell array 640, and the program/read circuit 660 may sense the values of the monitor cells coupled to the monitor cell string (for example, the last bit line) of the memory cell array 640. The CSC may count the number of monitor cells of which the erase states were changed. Thus, the memory device 150 may detect the read stress level (i.e., the read disturb) based on the value of the CSC, and compare the count value and the threshold value to generate a signal for determining whether to perform a reclaim operation, at step 1119. For example, the memory device 150 may transmit a fail signal to the controller 130 when the sensed count value exceeds the threshold value, and transmit a pass signal to the controller 130 when the sensed count value is lower than the threshold value, at step 1121. The controller 130 may analyze the fall or pass signal received from the memory device 150, at step 1123. According to the analysis result, the controller 130 may determine whether to reclaim the corresponding block. For example, the controller 130 may set the corresponding block to a reclaim block when the fail signal is received, and wait for the next cycle when the pass signal is received.

Figure 12:
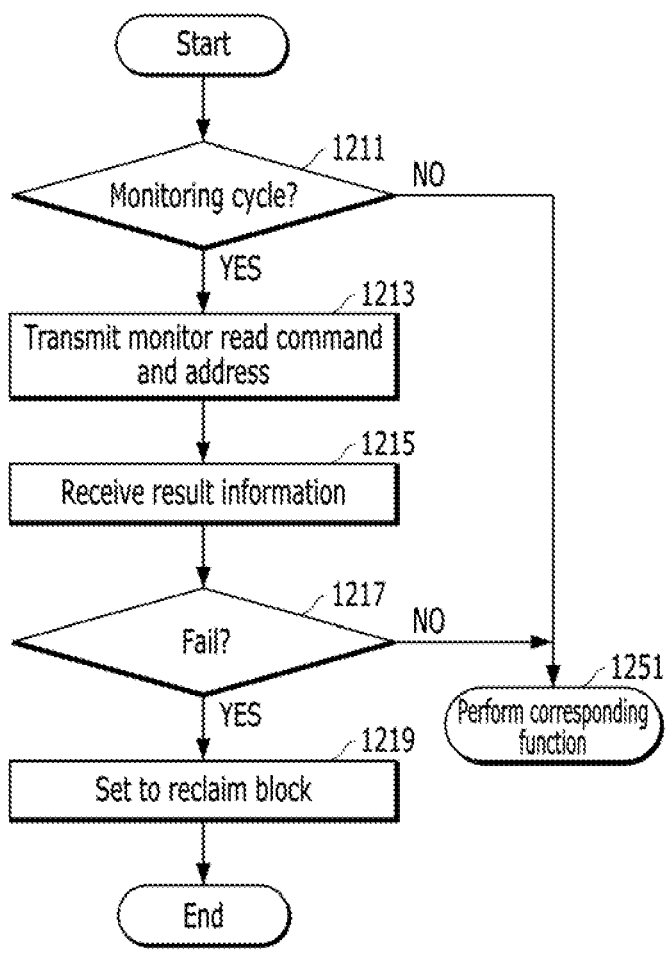
FIG. 12 is a flowchart illustrating a method in which a controller measures read stress of a memory device in accordance with an embodiment.

FIG. 12 is a flowchart illustrating a method in which a controller 130 measures read stress in a memory device in accordance with an embodiment of the present invention.

Referring to FIG. 12, when the read count value becomes equal to a preset value, the controller 130 may recognize this point of time as the monitoring cycle, at step 1211. Then, the controller 130 may transmit a monitor read command and address information to the memory device 150 at step 1213. Upon receiving the monitor read command, the memory device 150 may read the monitor cells and transmit a monitoring result information of the monitor cells to the controller 130. The controller 130 may receive the monitoring result information at step 1215. When it is determined that the monitor result information indicates a fail at step 1217, the controller 130 may set the corresponding block to a reclaim block at step 1219.

When it is determined that the monitoring result information indicates a pass at step 1217, the controller 130 may proceed to step 1251 to perform a corresponding function.

Figure 13:
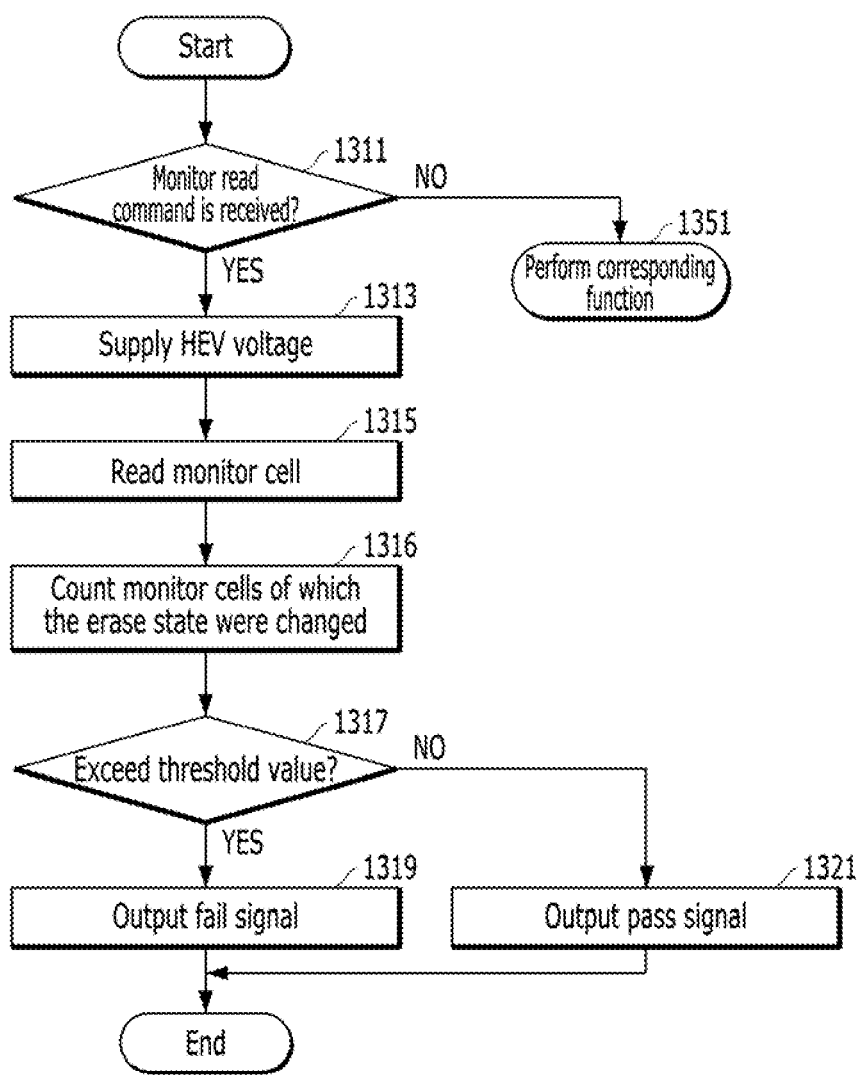
FIG. 13 is a flowchart illustrating a method in which a memory device measures read stress in accordance with an embodiment.

FIG. 13 is a flowchart illustrating a method in which the memory device 150 measures read stress in accordance with an embodiment of the present invention.

Referring to FIG. 13, when recognizing that the monitor read command is received at step 1311, the memory device 150 may supply the monitor voltage (e.g., HEV voltage) to a selected block at step 1313. The memory device 150 may select monitor cells of the selected block, and read the values of the selected monitor cells, at step 1315. The memory device 150 may include a current sensing counter (CSC) capable of sensing and counting the currents of the monitor cells. The memory device 150 may detect a read disturb level by counting the number of monitor cells of which the erase states were changed, through the CSC, at step 1315. The memory device 150 may then compare the count value of the CSC with a preset threshold value, and set a fail or pass signal for the corresponding block, at step 1317. When it is determined that the count value of the CSC exceeds the threshold value, the memory device 150 may transmit or output the fail signal to the controller 130 at step 1319. On the other hand, when it is determined that the count value of the CSC is smaller than the threshold value, the memory device 150 may generate the pass signal and transmit or output the pass signal to the controller 130 at step 1321.

In accordance with an embodiment, the apparatus and method for controlling a memory device may program the bits (i.e., monitor cells) at specific positions of the memory device 150 to the erase state in the write mode, such that data are not written to the monitor cells. The apparatus and method may read the monitor cells as the monitor voltage (e.g., HEV voltage for read disturb monitoring) at the monitoring cycle, and count the number of monitor cells of which the states were changed from the erase level to another level. When the count value exceeds the preset value, the apparatus and method may determine that the read disturb amount is dangerous, and reclaim the corresponding block. In accordance with an embodiment, the apparatus and method may read the values of the monitor cells through a one-time read operation, and detect the read disturb amount of the memory device.

The memory device 150 may set the positions of the monitor cells to specific positions of the memory cell array 640 (for example, bit line located at a specific position). The controller 130 or the memory device 150 needs to perform an operation for programming the monitor cells to the erase data in the write mode. In another embodiment, repair cells (or redundancy cells) may be used. The repair cells having no data programmed therein may retain the erase state. The controller 130 and the memory device 150 may write data to normal memory cells in the write mode, and read the value of the repair cells at the monitoring cycle, in order to detect a read disturb amount. That is, when detecting the read disturb amount of the memory device 150 according to the method of FIGS. 7 to 13, the controller 130 and the memory device 150 may detect the read disturb amount by reading the value of the repair cells instead of reading the values of the monitor cells.

Furthermore, a nonvolatile memory device such as 3D NAND may have a read disturb amount which differs at each erase/write (EW) cycle. Therefore, when the positions of the monitor cells in the memory device are not fixed to specific positions but variably applied, the read disturb amount can be detected regardless of EW stress.

In accordance with an embodiment, the apparatus and method for controlling a memory device may detect a read disturb level by reading monitor cells installed in a nonvolatile memory device such as 3D NAND flash using the monitor voltage (e.g., HEV voltage of erased string), and determine whether to perform a reclaim operation based on the detected read disturb level. For example, the 3D NAND flash memory has a disadvantage in that it cannot frequently store a read count during a test for a combination of sudden power-off (SPO) and read stress. However, the apparatus and method for controlling a memory device in accordance with an embodiment of the present invention can determine a read stress level through a one-time read operation, thereby removing the above-described disadvantage.

Hereinbelow, detailed descriptions will be made with reference to FIGS. 14 to 19, of electronic devices employing a memory system, according to various embodiments of the present invention.

Figure 14:
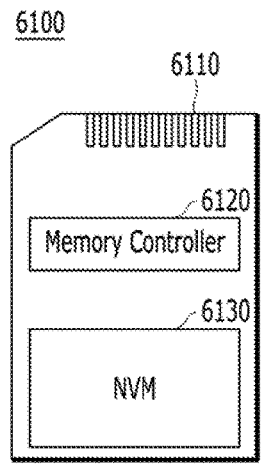
FIGS. 14 to 19 are block diagrams illustrating examples of a data processing system including a memory system according to an embodiment of the present invention.

FIG. 14 is a diagram illustrating an example of a data processing system including a memory system according to an embodiment of the present invention. Specifically, FIG. 14 illustrates a memory card system 6100 employing the memory system, according to an embodiment of the present invention.

Referring now to FIG. 14, the memory card system 6100 may include a memory controller 6120, a memory device 6130, and a connector 6110.

The memory controller 6120 may be operatively connected with the memory device 6130. The memory controller 6120 may access the memory device 6130 for controlling the operations of the memory device 6130. For example, the memory controller 6120 may control the read, write, erase and background operations of the memory device 6130. The memory controller 6120 may provide an interface between the memory device 6130 and a host (not shown) via the connector 6110. The memory controller 6120 may drive a firmware for controlling the memory device 6130.

The memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit.

The memory controller 6120 may communicate with an external device, for example, the host 102 described above with reference to FIG. 1, through the connector 6110. For example, as described above with reference to FIG. 1, the memory controller 6120 may be configured to communicate with the external device through at least one of various communication protocols such as a universal serial bus (USB), a multimedia card (MMC), an embedded MMC (eMMC), a peripheral component interconnection (PCI), a PCI express (PCIe), an Advanced Technology Attachment (ATA), a Serial-ATA, a Parallel-ATA, a small computer system interface (SCSI), an enhanced small disk interface (ESDI), an Integrated Drive Electronics (IDE), a Firewire, universal flash storage (UFS), wireless-fidelity (WI-FI) and a Bluetooth. The memory system and the data processing system may be applied to wired and/or wireless electronic appliances, for example, a mobile electronic appliance.

The memory device 6130 may be a nonvolatile memory (NVM). For example, the memory device 6130 may be implemented with one of various nonvolatile memory devices such as, for example, an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may form a solid state driver (SSD) by being integrated into a single semiconductor device. Also, the memory controller 6120 and the memory device 6130 may form a memory card such as a PC card (e.g., Personal Computer Memory Card International Association (PCM-CIA)), a compact flash card (CF), a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 15:
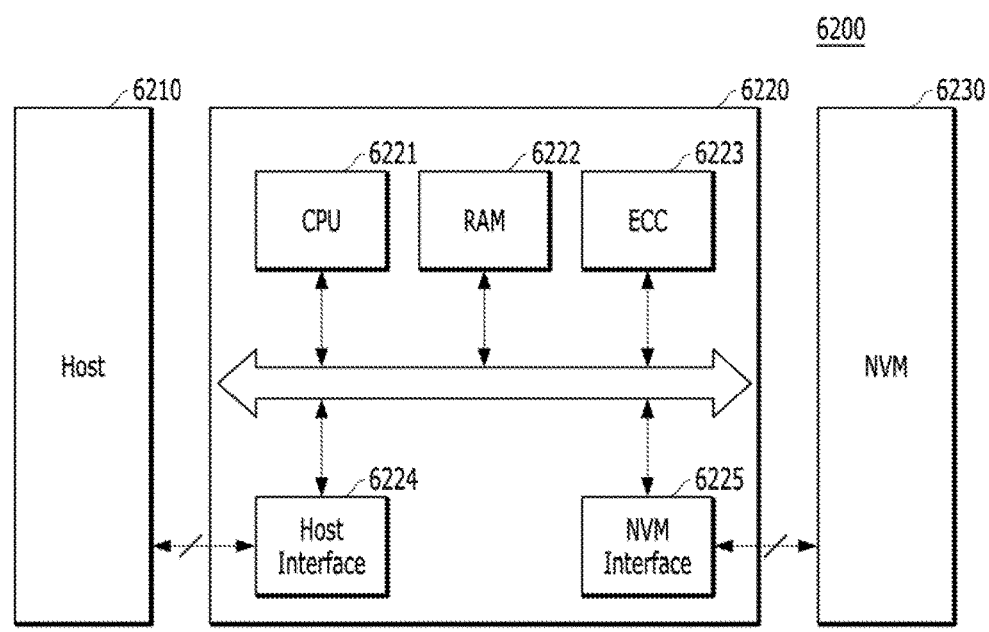

FIG. 15 is a diagram illustrating another example of a data processing system 6200 including a memory system, according to an embodiment of the present invention.

Referring to FIG. 15, the data processing system 6200 may include a memory device 6230 which is implemented by at least one nonvolatile memory NVM and a memory controller 6220 which controls the memory device 6230. The data processing system 6200 may be a storage medium such as a memory card (e.g., a CF, a SD or a microSD), as described above with reference to FIG. 1. The memory device 6230 may correspond to the memory device 150 in the memory system 110 described above with reference to FIG. 1. The memory controller 6220 may correspond to the controller 130 in the memory system 110 described above with reference to FIG. 1.

The memory controller 6220 may control the operations for the memory device 6230 including read, write and erase operations in response to commands received from a host 6210. The memory controller 6220 may include at least one of a central processing unit (CPU) 6221, a random access memory (RAM) as a buffer memory 6222, an error correction code (ECC) circuit 6223, a host interface 6224, and an NVM interface as a memory interface 6225, all electrically coupled via an internal bus.

The CPU 6221 may control the operations for the memory device 6230, for example, read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 may be used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 may correspond to the ECC unit 138 of the controller 130 described above with reference to FIG. 1. As described above with reference to FIG. 1, the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using one of various coded modulations such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 may transmit and receive data to and from the host 6210 through the host interface 6224, and transmit and receive data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as wireless fidelity (WI-FI) or long term evolution (LTE) is implemented, the memory controller 6220 may transmit and receive data by being connected with an external device, for example, the host 6210 or another external device other than the host 6210. Specifically, as the memory controller 6220 is configured to communicate with an external device through at least one among various communication protocols, the memory system and the data processing system according to the embodiment may be applied to wired and/or wireless electronic appliances, for example, a mobile electronic appliance.

Figure 16:
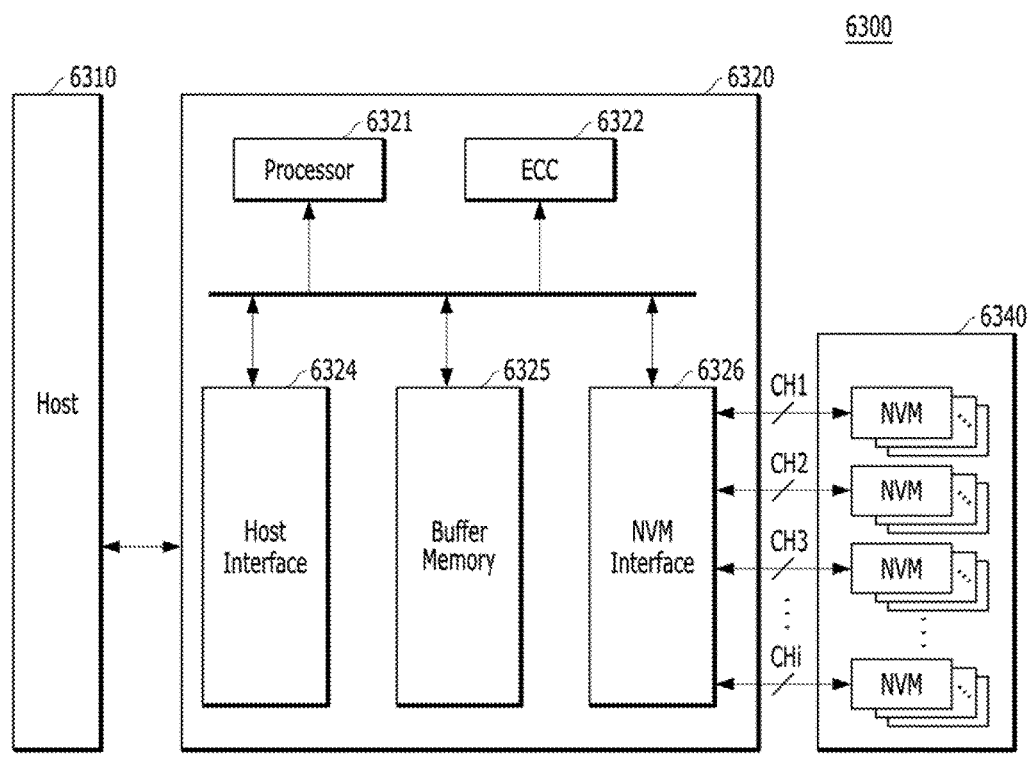

FIG. 16 is a diagram illustrating another example of a data processing system including a memory system according to an embodiment of the present invention. For example, in FIG. 16, a solid state drive (SSD) 6300 employing a memory system is shown.

Referring to FIG. 16, the SSD 6300 may include a memory device 6340 which may include a plurality of nonvolatile memories NVM, and a controller 6320. The controller 6320 may correspond to the controller 130 in the memory system 110 described above with reference to FIG. 1. The memory device 6340 may correspond to the memory device 150 in the memory system 110 described above with reference to FIG. 1.

The controller 6320 may be connected with the memory device 6340 through a plurality of channels CH1, CH2, CH3, . . . and CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 may temporarily store data received from a host 6310 or data received from a plurality of nonvolatile memories NVM included in the memory device 6340, or temporarily store metadata of the plurality of nonvolatile memories NVM. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 10, for the sake of convenience in explanation, that the buffer memory 6325 is disposed inside the controller 6320, it is to be noted that the buffer memory 6325 may be disposed outside the controller 6320.

The ECC circuit 6322 may calculate error correction code values of data to be programmed in the memory device 6340 in a program operation, perform an error correction operation for data read from the memory device 6340, based on the error correction code values, in a read operation, and performs an error correction operation for data recovered from the memory device 6340 in a recovery operation for failed data.

The host interface 6324 may provide an interface function with respect to an external device, for example, the host 6310. The nonvolatile memory interface 6326 may provide an interface function with respect to the memory device 6340 which is connected through the plurality of channels CH1, CH2, CH3, . . . and CHi.

In an embodiment, a redundant array of independent disks (RAID) system is provided the system including a plurality of SSDs 6300. Each SSD 6300 may employ the memory system 110 described above with reference to FIG. 1. In the RAID system, the plurality of SSDs 6300 and an RAID controller for controlling the plurality of SSDs 6300 may be included. In the case of performing a program operation by receiving a write command from the host 6310, the RAID controller may select at least one memory system (for example, at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310, the RAID controller may select at least one memory system (for example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 17:
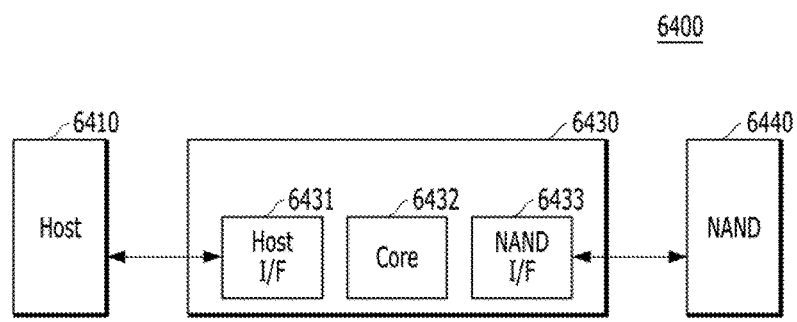

FIG. 17 is a diagram illustrating another example of a data processing system including a memory system, according to an embodiment of the present invention. For example, in FIG. 17, an embedded multimedia card (eMMC) 6400 is shown.

Referring to FIG. 17, the eMMC 6400 may include a memory device 6440 which is implemented with at least one NAND flash memory, and a controller 6430. The controller 6430 may correspond to the controller 130 in the memory system 110 described above with reference to FIG. 1. The memory device 6440 may correspond to the memory device 150 in the memory system 110 described above with reference to FIG. 1.

The controller 6430 may be connected with the memory device 6440 through a plurality of channels. The controller 6430 may include a core 6432, a host interface 6431, and a memory interface, for example, a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface, for example, an MMC interface, as described above with reference to FIG. 1, or may be a serial interface, for example, an ultra-high speed class 1 (UHS-I)/UHS class 2 (UHS-II) and a universal flash storage (UFS) interface.

Figure 18:
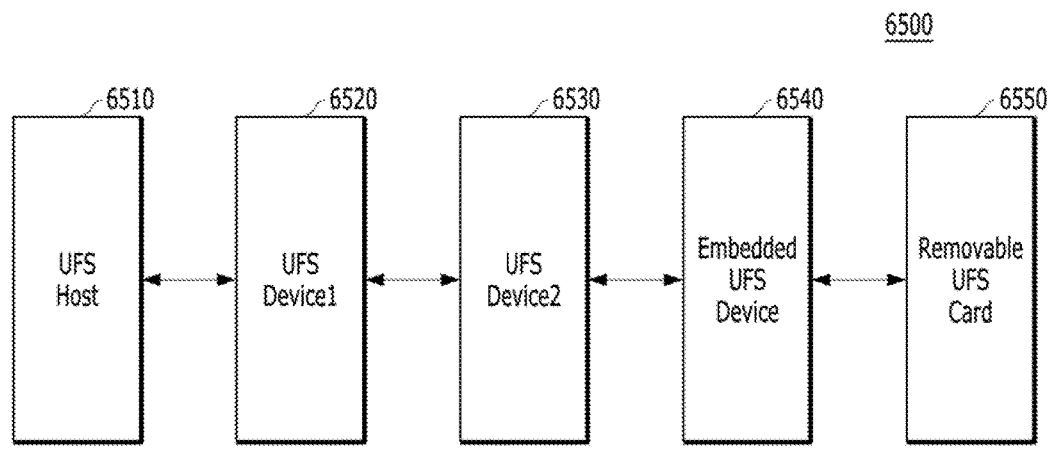

FIG. 18 is a diagram illustrating another example of a data processing system including a memory system, according to an embodiment of the present invention. For example, FIG. 18 illustrates a universal flash storage (UFS) system 6500 employing a memory system according to an embodiment of the invention.

Referring to FIG. 18, the UFS system 6500 may include a UFS host 6510, a plurality of UFS devices 6520 and 6530, an embedded UFS device 6540, and a removable UFS card 6550. The UFS host 6510 may be an application processor of wired and/or wireless electronic appliances, for example, a mobile electronic appliance.

The UFS host 6510, the UFS devices 6520 and 6530, the embedded UFS device 6540 and the removable UFS card 6550 may respectively communicate with external devices such as wired and/or wireless electronic appliances (for example, a mobile electronic appliance), for example, through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 10. The embedded UFS device 6540 and the removable UFS card 6550 may also communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 19:
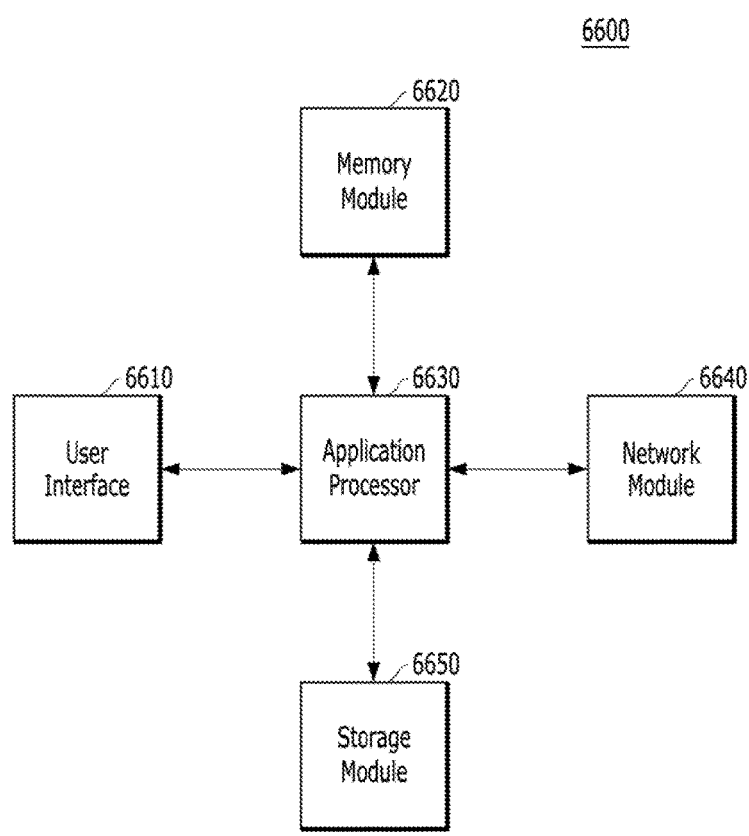

FIG. 19 is a diagram illustrating another example of a data processing system including a memory system according to an embodiment of the present invention. For example, in FIG. 19, a user system 6600 employing the memory system is shown.

Referring to FIG. 19, the user system 6600 may include a user interface 6610, a memory module 6620, an application processor 6630, a network module 6640, and a storage module 6650.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WIMAX), wireless local area network (WLAN), ultra-wideband (UWB), Bluetooth, wireless display (WI-DI), and so on, and may thereby communicate with wired and/or wireless electronic appliances, for example, a mobile electronic appliance. Accordingly, the memory system and the data processing system may be applied to wired and/or wireless electronic appliances. The network module 6640 may be included in the application processor 6630.

The storage module 6650 may store data, for example, data received from the application processor 6630, and transmit data stored therein, to the application processor 6630. The storage module 6650 may be implemented by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 16 to 18.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module controls wired and/or wireless communication with an external device, as described above. The user interface 6610 as the display/touch module of the mobile electronic appliance displays data processed by the application processor 6630 or supports input of data from a touch panel.

Although various embodiments of the present invention have been described for illustrative purposes, it will be apparent to those skilled in the art that various other changes and modifications may be made without departing from the spirit and scope of the invention as defined in the following claims.

What is claimed is:

1. An apparatus comprising:
a memory device suitable for writing data in a plurality of memory cells except plural monitor cells in a write mode, wherein the plural monitor cells are coupled via at least one bit line, and reading the plural monitor cells in a monitor mode; and
a controller suitable for transmitting a monitor command and address information for reading the plural monitor cells to the memory device in the monitor mode, using a hard erase verify voltage to determine charge distributions of the plural monitor cells read from the memory device, and determining whether to perform a read reclaim operation based on the change of the charge distributions of the plural monitor cells.

2. The apparatus of claim 1, wherein the plural monitor cells are located at the last bit line of each word line in the memory device.

3. The apparatus of claim 1, wherein the memory device reads the plural monitor cells by the hard erase verify (HEV) voltage for reading the plural monitor cells in the monitor mode.

4. The apparatus of claim 1, wherein the controller transmits a write command, address information and data to the memory device in the write mode, and
the data comprises data reconfigured to write erase data to the plural monitor cells.

5. The apparatus of claim 4, wherein the controller transmits the monitor command and the address information for reading the plural monitor cells to the memory device at a monitoring cycle,
wherein the controller analyzes the plural monitor cells read in the memory device, and sets the corresponding region of the memory device to a reclaim region when the number of monitor cells in a non-erase state exceed a threshold value.

6. The apparatus of claim 5, wherein the controller enables the monitoring cycle when the value of a read counter is equal to a preset count, and transmits the monitor command and the address information for reading the plural monitor cells to the memory device.

7. An apparatus comprising:
a controller suitable for transmitting a monitor command and address information at a monitoring cycle; and
a memory device suitable for writing data to a plurality of memory cells except plural monitor cells in a write mode, wherein the plural monitor cells are coupled via at least one bit line, supplying a hard erase verify voltage to the plural monitor cells when the monitor command and address information are received, recognizing charge distributions of the plural monitor cells, determining change of the charge distributions of the plural monitor cell, and transmitting a fail signal to the controller when the change of the charge distributions of the plural monitor cells exceed a threshold value,
wherein the controller sets the corresponding region of the memory device to a reclaim region when the fail signal is received.

8. The apparatus of claim 7, wherein the memory device writes data to a region excluding the bit line to which the plural monitor cells are coupled, in the write mode.

9. The apparatus of claim 7, wherein the controller enables the monitoring cycle, and transmits the monitor command and the address information to the memory device.

10. The apparatus of claim 9, wherein the memory device counts the number of monitor cells changed from an erase state by sensing read currents of the plural monitor cells read in a monitor mode, and transmits the fail signal to the controller when the change of the values of the plural monitor cells exceed the threshold value.

11. The apparatus of claim 10, wherein the hard erase verify (HEV) voltage is used for reading the plural monitor cells in the monitor mode.

12. The apparatus of claim 7, wherein the plural monitor cells comprise repair cells.

13. A method for controlling a memory device, comprising:
transmitting a write command, address information and data to a memory device to write data in a plurality of memory cells except plural monitor cells in a write mode, wherein the plural monitor cells are coupled via at least one bit line at a specific position of the memory device, the data being configured to erase the plural monitor cells; and performing a monitor mode, wherein the monitor mode comprises:

transmitting a monitor command and address information of a monitoring region to the memory device at a monitoring cycle;

receiving charge distributions of the plural monitor cells read by a hard erase verify voltage supplied to the monitoring region in the memory device; and determining whether to perform a read reclaim operation based on the change of the charge distributions of the plural monitor cells.

14. The method of claim 13, further comprising determining that the corresponding region of the memory device is a reclaim region, when the count value for the number of monitor cells changed from an erase state exceed a preset threshold value.

15. The method of claim 14, wherein the monitoring cycle is enabled when the value of a read counter at the specific region of the memory device exceeds a preset count value.

16. The method of claim 14, further comprising reconfiguring data by removing the data of the plural monitor cells from a data sequence received from the memory device in a read mode.

17. An operating method of a memory device, the memory device including a memory cell array in which memory cells at a specific position are set to monitor cells written in an erase state, the operating method comprising:

writing data in a plurality of memory cells except plural monitor cells in response to a write command, wherein the plural monitor cells are coupled via at least one bit line;

receiving a monitor command and address information at a monitoring cycle;

supplying a hard erase verify voltage to the plural monitor cells of a region corresponding to the address information when the monitor command is received;

recognizing charge distributions of the plural monitor cells; and transmitting a fail signal for reclaiming the corresponding region based on change of charge distributions of the plural monitor cells.

18. The operating method of claim 17, wherein the transmitting of the fail signal comprises:

sensing currents of the plural monitor cells using the hard erase verify voltage;

counting the number of monitor cells of which the currents are changed from the erase state;

generating the fail signal when the count value exceeds a threshold value; and transmitting the generated fail signal.

\* \* \* \* \*